United States Patent
Gopalan et al.

(10) Patent No.: US 9,287,827 B2
(45) Date of Patent: Mar. 15, 2016

(54) SYSTEM AND METHOD TO DEMODULATE A LOAD MODULATED SIGNAL

(71) Applicant: QUALCOMM Incorporated, San Diego, CA (US)

(72) Inventors: RaviKiran Gopalan, San Diego, CA (US); Koorosh Akhavan, San Diego, CA (US); Le Nguyen Luong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 115 days.

(21) Appl. No.: 13/786,693

(22) Filed: Mar. 6, 2013

(65) Prior Publication Data

US 2014/0062588 A1 Mar. 6, 2014

Related U.S. Application Data

(60) Provisional application No. 61/697,582, filed on Sep. 6, 2012.

(51) Int. Cl.
| | |
|---|---|
| *H04B 5/00* | (2006.01) |
| *H03D 3/00* | (2006.01) |
| *G06K 7/10* | (2006.01) |

(52) U.S. Cl.
CPC ............... *H03D 3/00* (2013.01); *H04B 5/0031* (2013.01); *H04B 5/0056* (2013.01); *H04B 5/0093* (2013.01); *G06K 7/10237* (2013.01); *H04B 5/00* (2013.01); *H04B 5/0025* (2013.01)

(58) Field of Classification Search
CPC ...... H04B 5/00; H04B 5/0025; H04B 5/0031; H04B 5/0056; H04B 5/0093; H03D 3/00; G06K 7/10237
USPC ............... 455/41.1; 340/854.8; 329/304, 313; 379/55.1; 381/79
See application file for complete search history.

(56) References Cited

U.S. PATENT DOCUMENTS

| | | | |
|---|---|---|---|
| 6,329,808 B1* | 12/2001 | Enguent | 324/76.77 |
| 2011/0051780 A1 | 3/2011 | Kawasaki | |
| 2011/0206160 A1 | 8/2011 | Sung et al. | |
| 2011/0292991 A1 | 12/2011 | Muramatsu | |
| 2012/0003930 A1 | 1/2012 | Lefley | |
| 2012/0231734 A1 | 9/2012 | Symons et al. | |
| 2012/0307873 A1* | 12/2012 | Kim et al. | 375/219 |

* cited by examiner

*Primary Examiner* — Richard Tan
(74) *Attorney, Agent, or Firm* — Kevin T. Cheatham

(57) ABSTRACT

A method includes demodulating a load modulated signal at an initiator device based at least partially on a phase adjusted comparison value corresponding to the load modulated signal.

36 Claims, 10 Drawing Sheets

SYSTEM AND METHOD TO DEMODULATE A LOAD MODULATED SIGNAL

CLAIM OF PRIORITY

The present application claims priority from U.S. Provisional Patent Application No. 61/697,582 filed on Sep. 6, 2012, the contents of which are expressly incorporated herein by reference in their entirety.

FIELD

The present disclosure is generally related to demodulating a load modulated signal.

DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones and other electronic devices may utilize a Near Field Communication (NFC) standard to communicate with other nearby devices that utilize the NFC standard. As an example, a mobile phone utilizing the NFC standard may operate in an initiator mode and read data from an electronic device operating in a target mode when the mobile phone and the electronic device are within a close proximity to each other (e.g., 40 mm) For example, in the initiator mode, the mobile phone may transmit radio-frequency (RF) signals to the electronic device via an electric field and corresponding RF signals are received by the mobile phone that include data values provided by the electronic device using load modulation of the electric field. Different data values may correspond to different signal strengths of the electric field. However, as the difference in signal strengths for various data values decreases, such as due to an increase in distance between the mobile phone and the electronic device, it may become increasingly difficult for the mobile phone to accurately detect the data values.

SUMMARY

Systems and methods are disclosed to demodulate a load modulated signal. An initiator device may transmit a signal by generating an oscillating electromagnetic field and may detect changes in the oscillating electromagnetic field. The changes in the oscillating electromagnetic field may result from a target device changing an activation state of a load of the target device. For example, the oscillating electromagnetic field may have a change in amplitude and a change in phase in response to the target device changing the activation state of its load. The initiator device may demodulate the resulting load modulated signal based on the change in amplitude of the oscillating electromagnetic field. In addition, or alternatively, the initiator device may demodulate the load modulated signal based on the change in phase of the oscillating electromagnetic field.

In a particular embodiment, an apparatus includes an initiator device configured to detect a load modulated signal based on a change in an electromagnetic field. The initiator device is further configured to demodulate the load modulated signal based at least partially on a phase adjusted comparison value corresponding to the load modulated signal. In a particular embodiment, a method includes demodulating a load modulated signal at an initiator device based at least partially on a phase adjusted comparison value corresponding to the load modulated signal.

In another particular embodiment, a method includes generating, at an initiator device, a comparison value based on a difference between a weighted version of a first set of samples of a bit period of a load modulated signal and a weighted version of a second set of samples of the bit period. The method further includes adjusting a phase component of the comparison value based on a phase offset detected during signal acquisition to generate an adjusted comparison value. The method further includes selecting a logical value corresponding to the bit period based on the adjusted comparison value.

In another particular embodiment, an apparatus includes a decision filter configured to generate a comparison value based on a difference between a weighted version of a first set of samples of a bit period of a load modulated signal and a weighted version of a second set of samples of the bit period. The first set of samples may correspond to portions of the bit period when a load of a target device is activated and the second set of samples may correspond to portions of the bit period when the load of the target device is deactivated. The apparatus further includes a multiplier configured to adjust a phase component of the comparison value based on a phase offset detected during signal acquisition to generate an adjusted comparison value. The apparatus further includes a maximum likelihood decoder configured to decode a logical value corresponding to the bit period based on the adjusted comparison value.

One particular advantage provided by at least one of the disclosed embodiments is an ability to determine a logical value transmitted via a load modulated signal when an amplitude difference (i.e., signal strength) of a load modulated signal indicating different logical values is relatively small. Other aspects, advantages, and features of the present disclosure will become apparent after review of the entire application, including the following sections: Brief Description of the Drawings, Detailed Description, and the Claims.

DETAILED DESCRIPTION

Figure 1:
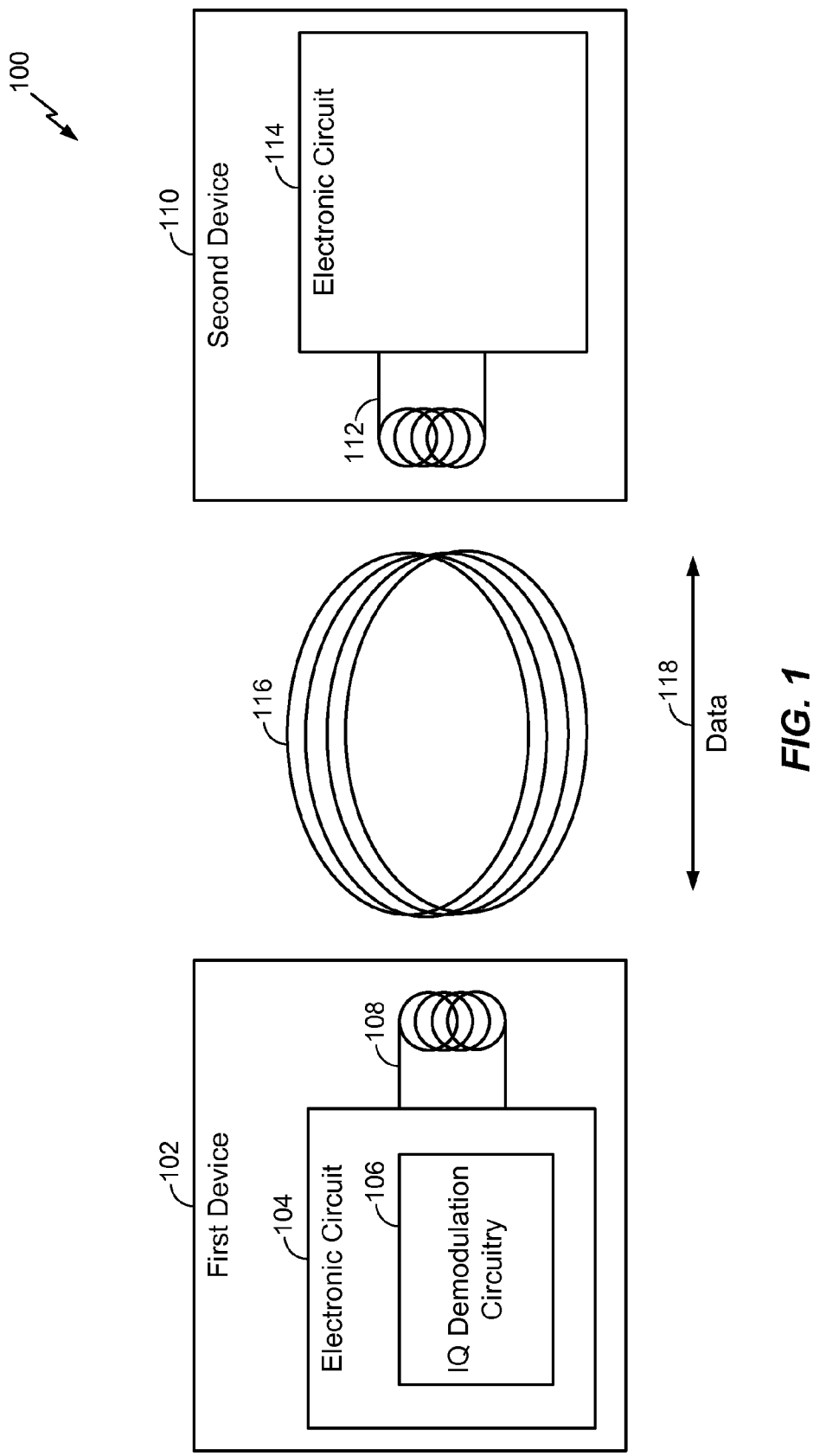
FIG. 1 is a block diagram of a particular illustrative embodiment of a system that is operable to demodulate a load modulated signal.

Referring to FIG. 1, a particular illustrative embodiment of a system 100 that is operable to demodulate a load modulated signal is shown. The system 100 includes a first device 102 and a second device 110. The first device 102 may be an initiator device and the second device 110 may be a target device.

The first device 102 includes a first electronic circuit 104. The first electronic circuit 104 includes in-phase and quadrature (IQ) demodulation circuitry 106 (e.g., amplitude and phase based demodulation circuitry) and is coupled to a first inductive coil 108. The first device 102 may include a power source and is configured to generate a reference field (i.e., an oscillating electromagnetic field 116) via the first inductive coil 108. The oscillating electromagnetic field 116 may oscillate at a carrier frequency ($f_C$) (e.g., at a carrier tone) of a particular strength. The first device 102 may also be configured to transmit data 118 to the second device 110 via the oscillating electromagnetic field 116.

The second device 110 is coupled to detect the oscillating electromagnetic field 116 via a second inductive coil 112. The second device 110 includes a second electronic circuit 114 that is coupled to the second inductive coil 112. The second device 110 further includes a load (i.e. an impedance) that is configured to switch activation states to communicate data 118 to the first device 102. The load may be a capacitor, a resistor, or any combination thereof, in parallel with the second inductive coil 112. The load of the second device 110 may selectively switch "on" and "off" during a bit period according to a first pattern of a coding scheme to communicate a logical "0" to the first device 102 and the load may selectively switch "on" and "off" during a bit period according to a second pattern of the coding scheme to communicate a logical "1" to the first device 102.

For example, a bit period may include 16 samples (i.e., time intervals). The first pattern of the coding scheme (i.e., communicating a logical "1") may call for the load of the second device 110 to switch to an "on" state during a first set of particular time intervals of the bit period and to switch to an "off" state during the remaining time intervals of the bit period. The second pattern of the coding scheme (i.e., communicating a logical "0") may call for the load of the second device 110 to switch to an "on" state during a second set of particular time intervals of the bit period and to switch to an "off" state during the remaining time intervals of the bit period. The first set of particular time intervals may be different from the second set of particular time intervals. In a particular embodiment, the first and second sets of particular time intervals may include common time intervals (of the 16 time intervals). In an alternate embodiment, as described with respect to the Manchester Coding in FIG. 2, the first set of particular time intervals may be mutually exclusive from the second set of particular time intervals (i.e., no common or overlapping time intervals when the load of the second device 110 switches to an "on" state).

When the load switches to the "on" state, an amplitude of the oscillating electromagnetic field 116 may increase or decrease based on an impedance of the load and/or a phase of the oscillating electromagnetic field 116 may change based on a reactance of the load. When the load switches to the "off" state, the amplitude and/or the phase of the oscillating electromagnetic field 116 may return to a prior condition.

The first device 102 is configured to detect changes in the oscillating electromagnetic field 116 via a receiver of the first device 102 that may include or be coupled to the first inductive coil 108 (i.e., an initiator device receiver). The signal strength of the received oscillating electromagnetic field 116 may vary based on a coupling strength of the first device 102 to the oscillating electromagnetic field 116, a coupling strength of the second device 110 to the oscillating electromagnetic field 116, geometric considerations corresponding to the positions of the first and second devices 102, 110 in relation to the oscillating electromagnetic field 116, and various process, voltage, and temperature (PVT) conditions. As explained above, the second device 110 may transmit logical values (i.e., bits of data 118) to the first device 102 by selectively activating the load (i.e., load modulation). The second device 110 may transmit bits of data 118 via load modulation by using an auxiliary sub-carrier and a line coding scheme, as described with respect to FIG. 2.

During operation, the IQ demodulation circuitry 106 of the first electronic circuit 104 may demodulate a load modulated signal based at least partially on a phase adjusted comparison value corresponding to the load modulated signal. The load modulated signal may correspond to a change (i.e., a change in phase and/or a change in amplitude) of the oscillating electromagnetic field 116 received by the initiator device receiver. The IQ demodulation circuitry 106 may also demodulate the load modulated signal based on the amplitude of the load modulated signal. An example of operation of the IQ demodulation circuitry 106 is described with respect to FIG. 4.

In a particular embodiment, the IQ demodulation circuitry 106 may undergo a signal acquisition process in which a predefined sequence of logical values is detected in the load modulated signal. For example, the IQ demodulation circuitry 106 may determine a phase offset of the oscillating electromagnetic field 116 and may determine an amplitude offset of the oscillating electromagnetic field 116 in response to detecting the predefined sequence of logical values. For each logical value in the predefined sequence of logical values, the IQ demodulation circuitry 106 may measure the phase of the oscillating electromagnetic field 116 and the amplitude of the oscillating magnetic field 116. The measured phase may correspond to the phase offset and the measured amplitude may correspond to the amplitude offset.

After the phase offset and amplitude offset are determined during signal acquisition, the second device 110 selectively communicates data 118 (i.e., logical values) to the first device 102 by selectively switching "on" and "off" its load. For example, during a first bit period the second device 110 may communicate a logical "0" by selectively switching "on" and "off" its load according to a first pattern of a coding scheme and during a second bit period the second device 110 may communicate a logical "1" by selectively switching "on" and "off" its load according to a second pattern of the coding scheme. The first pattern of the coding scheme (i.e., communicating a logical "0") may call for the load of the second device 110 to switch to an "on" state during a first set of particular time intervals of the bit period and to switch to an "off" state during the remaining time intervals of the bit period. The second pattern of the coding scheme (i.e., communicating a logical "1") may call for the load of the second device 110 to switch to an "on" state during a second set of particular time intervals of the bit period and to switch to an "off" state during the remaining time intervals of the bit period.

Each bit period (i.e., the first and second bit periods) may include a first set of samples corresponding to portions (i.e., time intervals) of the bit period when the load is activated (i.e., switched "on") and a second set of samples corresponding to portions of the bit period when the load is deactivated (i.e., switched "off"), where each set of samples of a bit period is weighted by a scaling factor. For example, if the second device 110 communicates a logical "0" during the first bit period, a first set of samples of the first bit period may have a first weighted scaling factor and a second set of samples of the first bit period may have a second weighted scaling factor. In addition or alternatively, if the second device 110 communicates a logical "1" during the second bit period, a first set of samples of the second bit period may have a third weighted scaling factor and a second set of samples of the second bit period may have a fourth weighted scaling factor. In a particular embodiment, the first weighted scaling factor may be substantially equal to the fourth weighted scaling factor and the second weighted scaling factor may be substantially equal to the third weighted scaling factor. In another embodiment, each weighted scaling factor may be distinct.

The IQ demodulation circuitry 106 may generate a comparison value based on a difference between the first set of samples of a bit period and a second set of samples of the bit period. The difference between the first set of samples of the bit period and the second set of samples of the bit period may correspond to a difference between a weighted version of the first set of samples (i.e., the first set of samples multiplied by a first weighted scaling factor) and a weighted version of the second set of samples (i.e., the second set of samples multiplied by a second weighted scaling factor). The IQ demodulation circuitry 106 may adjust a phase component of the comparison value based on the phase offset detected during the signal acquisition of the load modulated signal to generate an adjusted comparison value. For example, as explained with respect to FIG. 4, the comparison value may be multiplied by the phase offset to generate the adjusted comparison value. The IQ demodulation circuitry 106 may select a logical value corresponding to the bit period based on the adjusted comparison value. For example, the IQ demodulation circuitry 106 may select whether the second device 110 communicated a logical "1" or a logical "0" based on the adjusted comparison value generated based on the phase offset determined during signal acquisition.

It will be appreciated that the system 100 of FIG. 1 may demodulate a load modulated signal based on a phase of the oscillating electromagnetic field 116, an amplitude of the oscillating electromagnetic field 116, or any combination thereof, as opposed to demodulating the load modulated signal solely based on the amplitude of the oscillating electromagnetic field 116. Adjusting the phase component of the comparison value based on the phase offset detected during signal acquisition may permit the first device 102 to account for a difference in phase in the oscillating electromagnetic field 116, which in turn, may differentiate between data values communicated by the second device 110 when the amplitude of the oscillating electromagnetic field 116 is substantially similar for different data values.

Figure 2:
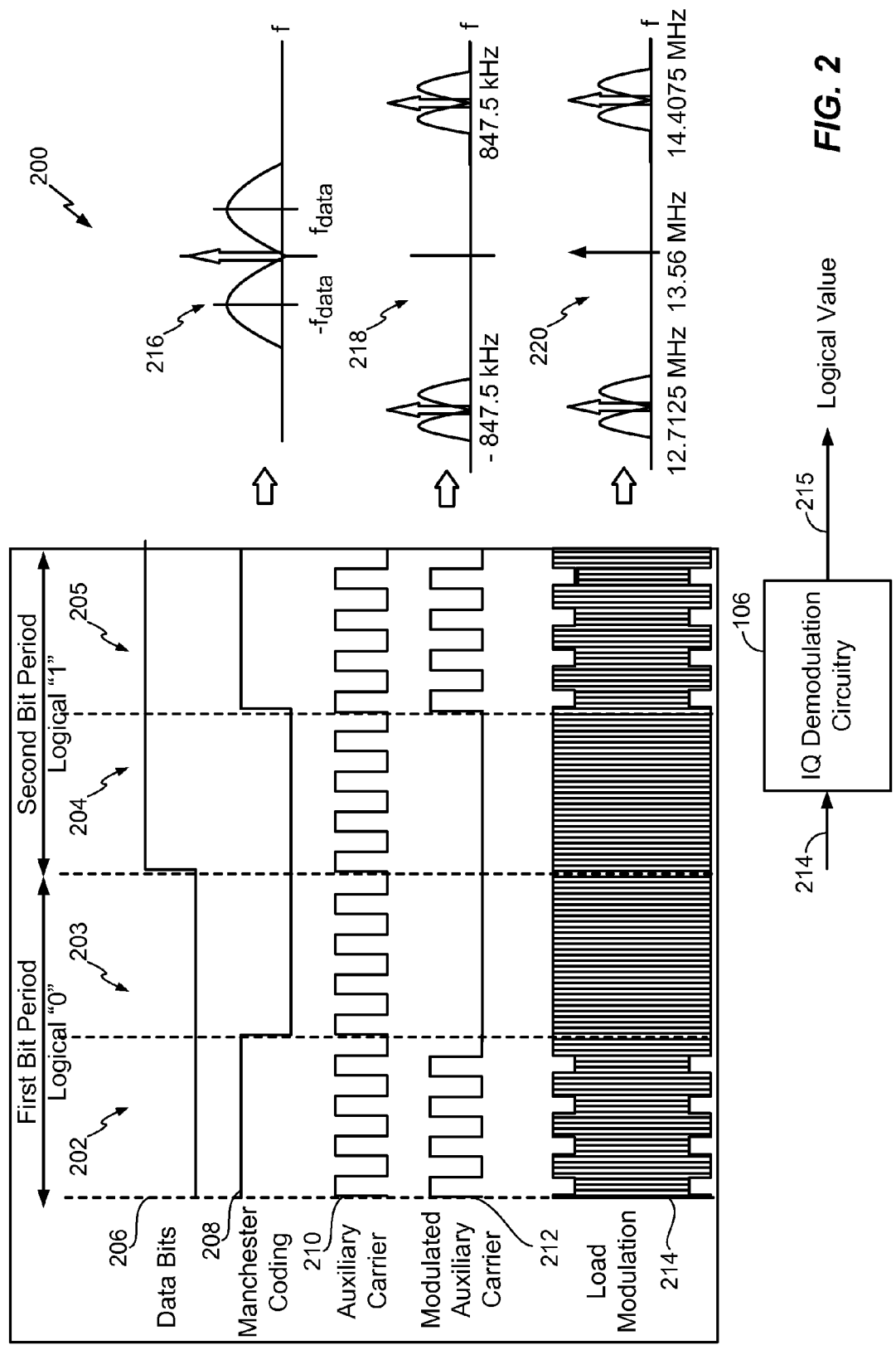
FIG. 2 is a particular illustrative embodiment of an auxiliary sub-carrier and coding scheme used to transmit a data bit via load modulation.

Referring to FIG. 2, a particular illustrative embodiment of an auxiliary sub-carrier and line coding scheme 200 used to transmit data bits via load modulation is illustrated. For example, the coding scheme 200 may correspond to a Near Field Communication (NFC) standard. Although the illustrated coding scheme 200 may be used for NFC standards, other coding schemes for other communication protocols to transmit data bits via load modulation may be utilized.

The coding scheme 200 depicted in FIG. 2 corresponds to a Manchester Coding scheme. This coding scheme 200 may be utilized by the system 100 of FIG. 1. In particular, the second device 110 may utilize the coding scheme 200 when transmitting data 118 to the first device 102 via the oscillating electromagnetic field 116. For example, during a first portion 202 of a first bit period corresponding to a logical "0", the second device 110 may alternately apply and remove the load, and during a second portion 203 of the first bit period the second device 110 may turn off the load.

A first stage 206 of the coding scheme 200 corresponds to values of the data bits that are to be transmitted by the second device 110. For example, the first and second portions 202, 203 of the first bit period of the first stage 206 correspond to a logical "0" and the first and second portions 204, 205 of a second bit period of the first stage 206 correspond to a logical "1". A second stage 208 of the coding scheme 200 corresponds to the Manchester Coding Scheme. For example, the first and second portions 202, 203 of the first bit period of the second stage 208 correspond to a Manchester Coding of a logical "0" and the first and second portions 204, 205 of the second bit period of the second stage 208 corresponds to a Manchester Coding of a logical "1". With reference to the second stage 208, the first bit period may have a total of 16 samples. A first set of samples may correspond to when the load of the second device 110 is activated (i.e., the first portion 202) and the second set of samples may correspond to when the load is deactivated (i.e., the second portion 203). It will be appreciated that when utilizing other coding schemes, the first and second set of samples may have different patterns when communicating data. For example, other coding schemes may call for the load of the second device 110 to selectively activate and deactivate at particular time intervals during both the first portion 202 and the second portion 203 rather than activating the load for the entire first portion 202 and deactivating the load for the entire second portion 203.

A third stage 210 of the coding scheme 200 corresponds to an auxiliary carrier that is modulated in the fourth stage 212 to generate a modulated auxiliary carrier. The fourth stage 212 corresponds to how the second device 110 switches the load on and off. For example, when the second device 110 switches the load "on" for the first portion 202 and "off" for the second portion 203, the Manchester Coding of the second stage 208 for a logical "0" may be mixed with the auxiliary carrier of the third stage 210 to generate a modulated auxiliary carrier corresponding to a logical "0" for the first and second portions 202, 203 of the first bit period of the fourth stage 212. Alternatively, when the second device 110 switches the load "off" for the first portion 204 and "on" for the second portion 205, the Manchester Coding of the second stage for a logical "1" may be mixed with the auxiliary carrier of the third stage 210 to generate a modulated auxiliary carrier corresponding to a logical "1" for the first and second portions 204, 205 of the second bit period of the fourth stage 212.

A fifth stage 214 of the coding scheme 200 corresponds to the load modulated signal transmitted by the second device 110 as received by the first device 102. For example, the fifth stage 214 corresponds to the envelope or the form of amplitude variation of the oscillating electromagnetic field 116.

The envelope may be an envelope of an amplitude of a sinusoidal carrier (shaded region) having various discontinuities. The discontinuities may correspond to a phase change in the load modulated signal.

The load modulated signal transmitted by the second device 110 during the fifth stage 214 of the coding scheme may be provided to the IQ demodulation circuitry 106. In a similar manner as described with respect to FIG. 1, the IQ demodulation circuitry 106 may determine a logical value 215 based on the load modulated signal. For example, the IQ demodulation circuitry 106 may determine that the second device 110 communicated a logical "0" during the first bit period and that the second device 110 communicated a logical "1" during the second bit period based on a phase adjusted comparison value corresponding to the load modulated signal illustrated in the fifth stage 214.

A first frequency plot 216 corresponds to a frequency range and center frequencies of the second stage 208 (i.e., the Manchester Coding). A second frequency plot 218 corresponds to a frequency range and center frequencies of the fourth stage 212 (i.e., the modulated auxiliary carrier). A third frequency plot 220 corresponds to a frequency range and center frequencies of the fifth stage (i.e., the load modulation signal). The frequency range may be from approximately 10 MHz to 15 MHz. As explained with respect to FIG. 3, tuning to a center frequency of approximately 13.56 MHz may include higher and lower frequency values within this frequency range.

Figure 3:
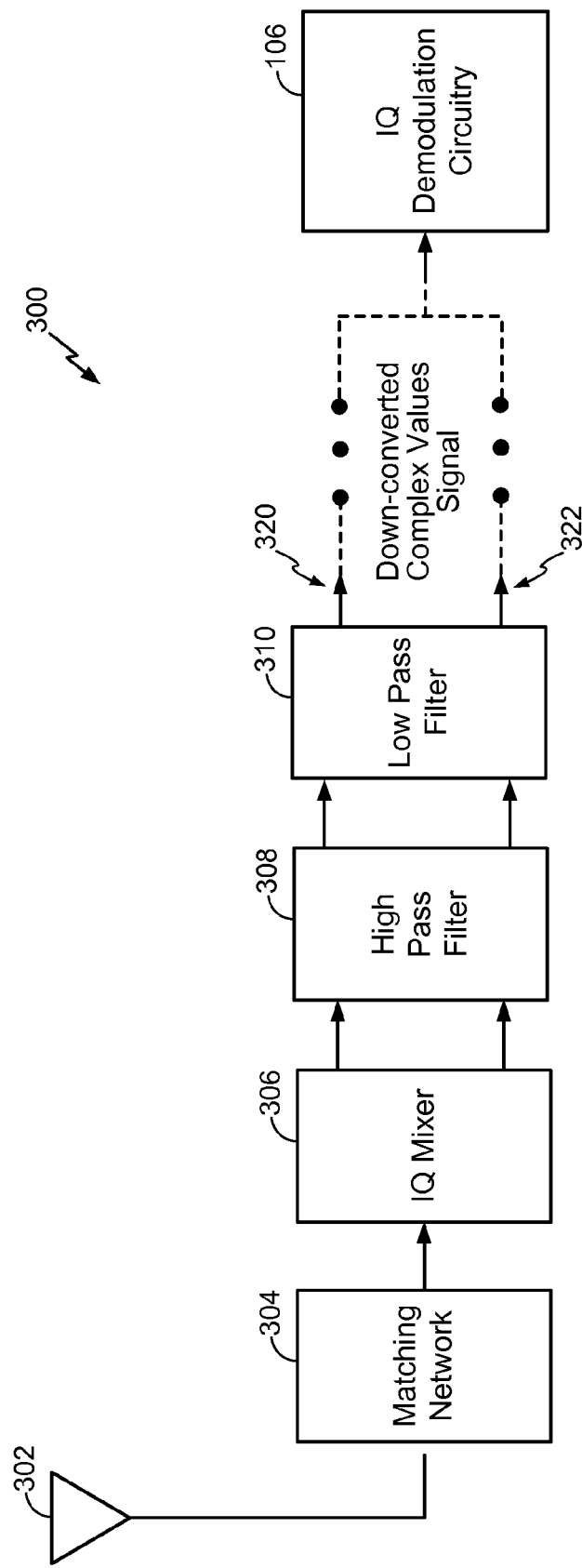
FIG. 3 is a particular illustrative embodiment of a receiver of an initiator device that is operable to generate a down-converted complex value of a load modulated signal.

Referring to FIG. 3, a particular illustrative embodiment of a receiver 300 of an initiator device that is operable to generate a down-converted complex value of a load modulated signal is shown. For example, the receiver 300 may correspond to the receiver of the first device 102 of FIG. 1. The receiver may include an antenna 302 (e.g., the first inductive coil 108 of FIG. 1), a matching network 304, an in-phase/quadrature (IQ) mixer 306, a high pass filter 308, and a low pass filter 310.

The antenna 302 is configured to detect an electromagnetic field. For example, the antenna 302 may detect the oscillating electromagnetic field 116 of FIG. 1. The matching network 304 is configured to select a tuning frequency range. For example, the matching network 304 may select to tune to a frequency range between approximately 10 MHz and 15 MHz, as described with respect to the third frequency plot 220 of FIG. 2. Thus, the matching network 304 may select to tune to a center frequency of 13.56 MHz and provides a signal (i.e., the load modulation signal corresponding to the fifth stage 216 of FIG. 2) to the IQ mixer 306.

The IQ mixer 306 is configured to receive the signal from the matching network 304 and to generate an in-phase baseband signal and a quadrature baseband signal. The down-converted baseband signals may correspond to a complex value signal having real (in-phase) and imaginary (quadrature) components that are separated by a phase difference. The in-phase baseband signal and the quadrature baseband signal are provided to the high pass filter 308. The high pass filter 308 is configured to remove direct-current (DC) components of the baseband signals. An output of the high pass filter 308 is provided to the low pass filter 310. The low pass filter 310 is configured to remove high-frequency noise of the filtered baseband signals. An output 320, 322 of the low pass filter 308 corresponds to a complex value signal having real and imaginary components 320 and 322, respectively.

As explained below with respect to FIG. 4, the output 320, 322 of the low pass filter 308 may be processed and provided to a demodulator, such as the IQ demodulation circuitry 106. The IQ demodulation circuitry 106 may select a logical value corresponding to a bit period. For example, the IQ demodulation circuitry 106 may select whether a logical "1" or a logical "0" is communicated via the oscillating electromagnetic field 116 and received via the antenna 302 (i.e., the first inductive coil 108) based on an adjusted comparison value generated based on a phase offset determined during signal acquisition.

In a particular embodiment, a signal x(t) transmitted by a target device, such as the second device 110 of FIG. 1, may be represented as:

$$x(t) = \overline{x} = \begin{cases} L_{-1} = A\overline{U}_1 + B\overline{U}_2 = ae^{j\phi_{off}}\overline{U}_1 + be^{j\phi_{on}}\overline{U}_2 \\ L_1 = B\overline{U}_1 + A\overline{U}_2 = be^{j\phi_{on}}\overline{U}_1 + ae^{j\phi_{off}}\overline{U}_2 \end{cases} \text{(Equation 1)}$$

In Equation 1, for a reference signal having a frequency ($f_c$) and an initial phase Θ, $\emptyset_{off}$ is the phase of the reference signal when the load is switched off, and $\emptyset_{on}$ is the phase of the reference signal when the load is switched on. In the particular embodiment, $L_{-1}$ may correspond to a logical "0" bit and $L_1$ may correspond to a logical "1" bit. For example, $L_{-1}$ may correspond to the first and second portions 202, 203 of the first bit period when the second device 110 transmits a logical "0" bit (e.g., when the second device 110 activates the load during the first portion 202 and deactivates the load during the second portion 203), and $L_1$ may correspond to the first and second portions 204, 205 of the second bit period when the second device 110 transmits a logical "1" bit (e.g., when the second device 110 deactivates the load during the first portion 204 and activates the load during the second portion 205).

The phase offset of the reference signal may be acquired during signal acquisition. For example, during signal acquisition, a predefined sequence of logical values (i.e., the logical sequence "1 0 0 0 1" for the Manchester Coding scheme 200 depicted in FIG. 2) may be detected in the load modulated signal. For each logical value in the predefined sequence of logical values, the phase of an electromagnetic field and the amplitude of the electromagnetic field may be measured. For example, the IQ demodulation circuitry 106 of FIG. 1 may measure the phase of the oscillating electromagnetic field 116 and the amplitude of the oscillating magnetic field 116 for each logical value. During signal acquisition, the average phase during the first and fifth bit periods (i.e., the bit periods when a logical "1" is communicated in the logical sequence "1 0 0 0 1") may correspond to the phase of the reference signal when the load of a target device (i.e., the second device 110 of FIG. 1) is switched on or toggled between on and off states according to a first pattern. The average phase during the second, third, and fourth bit periods (i.e., the bit periods when a logical "0" is communicated in the logical sequence "1 0 0 0 1") may correspond to the phase of the reference signal when the load of the target device is switched off or toggled between on and off states according to a second pattern. The measured phase may correspond to the phase offset and the measured amplitude may correspond to the amplitude offset.

$\overline{U}_1$ is a selector that corresponds to portions of a bit period when the load of the second device 110 is activated (i.e., the first set of samples). For example, with reference to the Manchester Coding illustrated in FIG. 2, $\overline{U}_1$ corresponds to the first portion 202 of the first bit period (or bit duration). $\overline{U}_2$ is a selector that corresponds to portions of a bit period when the load of the second device 110 is deactivated. For example, with reference to the Manchester Coding illustrated in FIG. 2, $\overline{U}_2$ corresponds to the second portion 203 of the first bit period. In the time domain, with reference to the Manchester Coding illustrated in FIG. 2, $\overline{U}_1$ and $\overline{U}_2$ may be represented as:

$$\overline{U}_1 = \begin{cases} 1 & 0 \le t \le \frac{T_b}{2} \\ 0 & \frac{T_b}{2} \le t \le T_b \end{cases}$$

$$\overline{U}_2 = \begin{cases} 0 & 0 \le t \le \frac{T_b}{2} \\ 1 & \frac{T_b}{2} \le t \le T_b \end{cases}$$

(Equation 2), where $T_b$ is the bit duration (i.e., the first bit period).

In a particular embodiment, a received signal r(t) at an initiator device, such as the first device 102 of FIG. 1, may be represented as:

$$r(t) = \overline{r} = R_1 \overline{U}_1 + R_2 \overline{U} = r_1 e^{j\phi_1} \overline{U}_1 + r_2 e^{j\phi_2} \overline{U}_2 \quad \text{(Equation 3)}.$$

It will be appreciated that the receiver 300 of FIG. 3 may generate a real component (i.e., an in-phase component) and an imaginary component (i.e., a quadrature component) of the load modulated signal by generating the down-converted complex value of the load modulated signal. Generating the real and imaginary components of the load modulated signal may enable the IQ demodulation circuitry 106 of FIG. 1 to compare the phase of the load modulated signal to the phase offset generated during signal acquisition. Comparing the phase of the load modulated signal to the phase offset may permit the IQ demodulation circuitry 106 to select a logical value corresponding to the load modulated signal.

Figure 4:
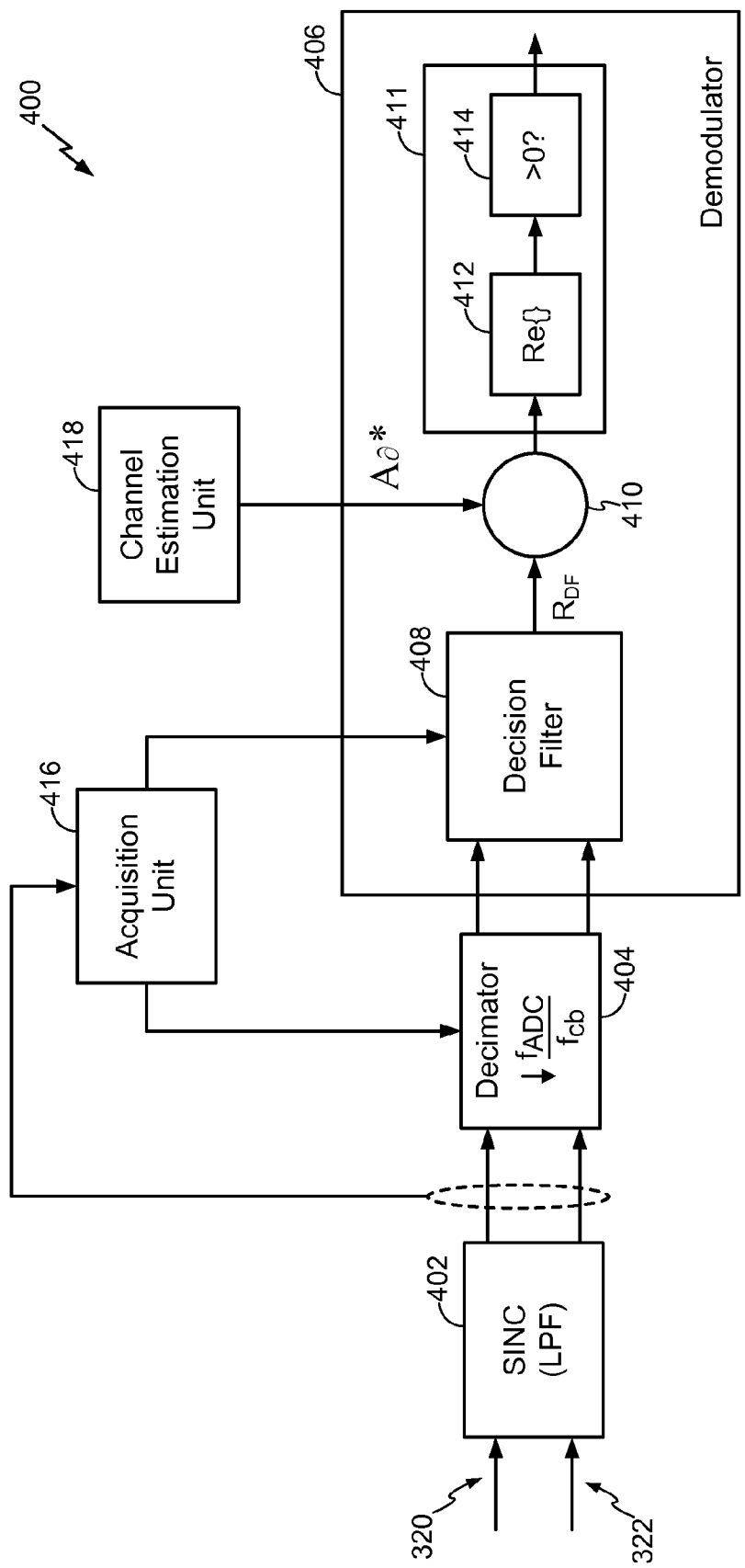
FIG. 4 is a block diagram of a particular illustrative embodiment of a system that is operable to demodulate a load modulation signal.

Referring to FIG. 4, a block diagram of a particular illustrative embodiment of a system 400 operable to demodulate a load modulation signal is shown. The system 400 may include a low pass filter 402, a decimator 404, a demodulator 406, an acquisition unit 416, and a channel estimation unit 418. The demodulator 406 includes a decision filter 408, a multiplier 410, and a decoder, such as a maximum likelihood decoder 411. The system 400 may be included in the first electronic circuit 104 of the first device 102 of FIG. 1. The demodulator 406 may correspond to the IQ demodulation circuitry 106 of FIG. 1.

The low pass filter 402 is configured to receive the in-phase baseband signal 320 and the quadrature baseband signal 322 of FIG. 3. The baseband signals 320, 322 may be oversampled. For example, the in-phase baseband signal 320 and the quadrature baseband signal 322 may include 32 or 64 samples per bit duration. The low pass filter 402 is configured to filter noise from the baseband signals and to provide filtered in-phase and quadrature signals to the decimator 404.

The decimator 404 is configured to down-sample the filtered baseband signals 320, 322 at a rate of $f_{ADC}/f_{CB}$. In a particular embodiment $f_{ADC}$ may be a frequency of an analog-to-digital conversion of the received signal (e.g., 32 MHz) and $f_{CB}$ may be a frequency of a coded bit (e.g., a frequency of the auxiliary carrier (the third stage 210 of FIG. 2)) equal to 8 MHz, resulting in a factor of 4 (i.e., ¼ of the samples are kept). For example, the decimator 404 may down-sample the filtered in-phase baseband signal 320 from a rate of 64 samples/bit to a rate of 16 samples/bit and may provide the result to the decision filter 408 of the demodulator 406. In addition, the decimator 404 may down-sample the filtered in-phase quadrature signal 322 from a rate of 64 samples/bit to a rate of 16 samples/bit and may provide the result to the decision filter 408 of the demodulator 406.

The acquisition unit 416 is configured to synchronize a clock of the decimator 404 and a clock of the decision filter 408. The decision filter 408 is configured to receive the output of the decimator 404 and to generate a comparison value ($R_{DF}$) based on a difference between a first portion ($\overline{U}_1$) of a first bit period of a load modulated signal and a second portion ($\overline{U}_2$) of the first bit period. For example, the comparison value ($R_{DF}$) may be based on the weighted version of different parts (e.g., the first set of samples ($\overline{U}_1$) and the second set of samples ($\overline{U}_2$)) of the signal (i.e., the load modulated signal) over a single bit-period (i.e., the first bit period). In a particular embodiment, the decision filter 408 may subtract the weighted version of the second set of samples ($\overline{U}_2$) from the weighted version of the first set of samples ($\overline{U}_1$) to generate the comparison value ($R_{DF}$). The comparison value ($R_{DF}$) is provided to the multiplier 410 along with a phase offset detected during signal acquisition.

The multiplier 410 is configured to adjust a phase component of the comparison value ($R_{DF}$) based on an IQ offset (i.e., an amplitude and phase offset) detected during the signal acquisition to generate an adjusted comparison value. Examples of the outputs of the decision filter 408 based on various types of input values are provided with respect to FIGS. 5-7.

The adjusted comparison value is provided to the maximum likelihood decoder 411. The maximum likelihood decoder 411 is configured to decode (or select) a logical value corresponding to the bit period based on the adjusted comparison value. For example, the maximum likelihood decoder 411 may determine that a logical "1" is received in response to a probability that the received signal r(t) corresponds to a logical "1" exceeds a probability that the received signal r(t) corresponds to a logical "0".

During operation, signal acquisition may occur prior to the generation of the comparison value ($R_{DF}$). During signal acquisition, a pre-defined logical sequence (e.g., the logical sequence "1 0 0 0 1") may be transmitted by the second device 110 using load modulation, and the pre-defined logical sequence may detected by the first device 102 to generate a channel estimation of the oscillating electromagnetic field 116. For example, the channel estimation may correspond to an amplitude offset and/or a phase offset (i.e., an IQ offset) of the oscillating electromagnetic field 116 and may be represented by a complex conjugate ($A_3^*$). The channel estimation (i.e., the IQ offset ($A_3^*$)) may have an initial phase of θ as described with respect to Equation 1 and may also have an initial amplitude. The initial phase and the initial amplitude may correspond to an IQ offset. In other embodiments, different logical sequences may be generated and detected during signal acquisition.

After the IQ offset ($A_3^*$) is determined, the decision filter 408 provides the comparison value ($R_{DF}$) to the multiplier 410 and the channel estimation unit 418 provides the IQ offset ($A_3^*$) to the multiplier 410. The multiplier 410 multiplies the comparison value ($R_{DF}$) by the IQ offset ($A_3^*$) to generate the adjusted comparison value. The adjusted comparison value may include a real component and an imaginary component. The adjusted comparison value is provided to the maximum likelihood decoder 411 and the real component of the adjusted comparison value is determined at stage 412. Stage 414 determines whether the real component of the adjusted comparison value is greater than zero. For example, the determination step in stage 414 may be expressed by $$Re\{A_S^*(R_1 - R_2)\} \ge 0$$

(Equation 4), where ($R_1 - R_2$) corresponds to the comparison value ($R_{DF}$). For example, $R_1$ may correspond to the weighted version of the first set of samples ($\overline{U}_1$) of the bit period and $R_2$ may correspond to the weighted version of the second set of samples ($\overline{U}_2$) of the bit period. If the real component is determined to be greater than zero at stage 414, then the logical value corresponding to the bit period is determined to be a logical "1". If the real component is not greater than zero, then the logical value corresponding to the bit period is determined to be a logical "0".

It will be appreciated that the system 400 of FIG. 4 may determine a logical value corresponding to a load modulated signal based on a phase of an oscillating electromagnetic field corresponding to the load modulated signal, an amplitude of the oscillating electromagnetic field corresponding to the load modulated signal, or any combination thereof, as opposed to demodulating the load modulated signal solely based on the amplitude of the oscillating electromagnetic field 116. Adjusting the phase component of the comparison value ($R_{DF}$) generated by the decision filter 408 based on the phase offset (e.g., the IQ offset) detected during signal acquisition may permit the demodulator 406 to account for a difference in phase in the oscillating electromagnetic field, which in turn, may differentiate between logical values communicated when the amplitude of the oscillating electromagnetic field (and of the load modulated signal) is substantially similar for different logical values.

Figure 5:
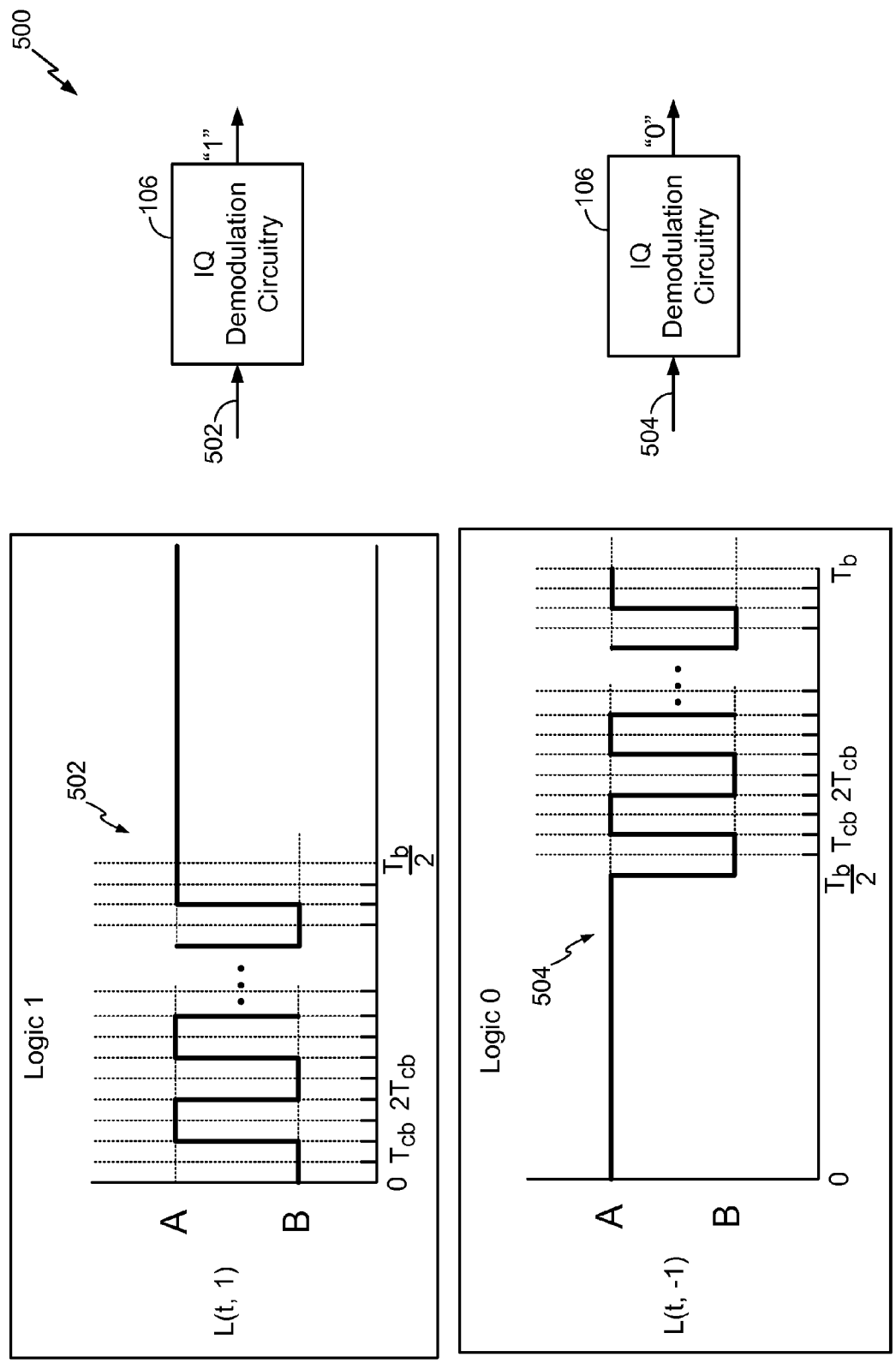
FIG. 5 is a particular illustrative embodiment of a graph illustrating a 106 Kbps Type A load modulation waveform.

Referring to FIG. 5, a particular illustrative embodiment of a graph 500 illustrating a 106 kilo-bits per second (Kbps) Type A load modulation waveform is shown in the graph 500 may correspond to the codingheme 200 of FIG. 2.

The graph 500 may correspond to a load modulation waveform having a bit rate of 106 Kbps. With reference to the graph 500, $T_b$ may correspond to the bit duration (e.g., when a first load modulated waveform 502 corresponding to a logical "1" may be communicated from the second device 110 to the first device 102 via the oscillating electromagnetic field 116). The first portion of the bit period (e.g., $<T_b/2$) may be scaled by a first weighted scaling factor (illustrated as a pulse at each coded bit duration $T_p$) and the second portion of the bit period (e.g., $>T_b/2$) may be scaled by a second weighted scaling factor. The first load modulated waveform 502 may be provided to the IQ demodulation circuitry 106 via the oscillating electromagnetic field 116 of FIG. 1. The IQ demodulation circuitry 106 may select a logical "1" based on a phase adjusted comparison value corresponding to the first load modulated waveform 502 in a similar manner as described with respect to FIG. 4.

As another example, a second load modulated waveform 504 corresponding to a logical "0" may be communicated from the second device 110 to the first device 102 via the oscillating electromagnetic field 116. The first portion of the bit period (e.g., $<T_b/2$) may be scaled by a third weighted scaling factor and the second portion of the bit period (e.g., $>T_b/2$) may be scaled by a fourth weighted scaling factor. The second load modulated waveform 504 may be provided to the IQ demodulation circuitry 106 via the oscillating electromagnetic field 116 of FIG. 1. The IQ demodulation circuitry 106 may select a logical "0" based on a phase adjusted comparison value corresponding to the and load modulated waveform 504 in a similar manneas described with respect to FIG. 4. In the particular embodiment, the first weighted scaling factor may be substantially equal to the fourth weighted scaling factor. Examples of the output (e.g., $R_1-R_2$) of the decision filter 408 for the Type A load modulation are:

Type A 106 Kbps: $R_1-R_2$=[-1 0 -1 0 -1 0 -1 0 1 0 1 0 1 0 1 0]
Type A 212 Kbps: $R_1-R_2$=[-1 1 -1 1 -1 1 -1 1]
Type A 424 Kbps: $R_1-R_2$=[-1 1 -1 1]
Type A 848 Kbps: $R_1-R_2$=[-1 1].

Figure 6:
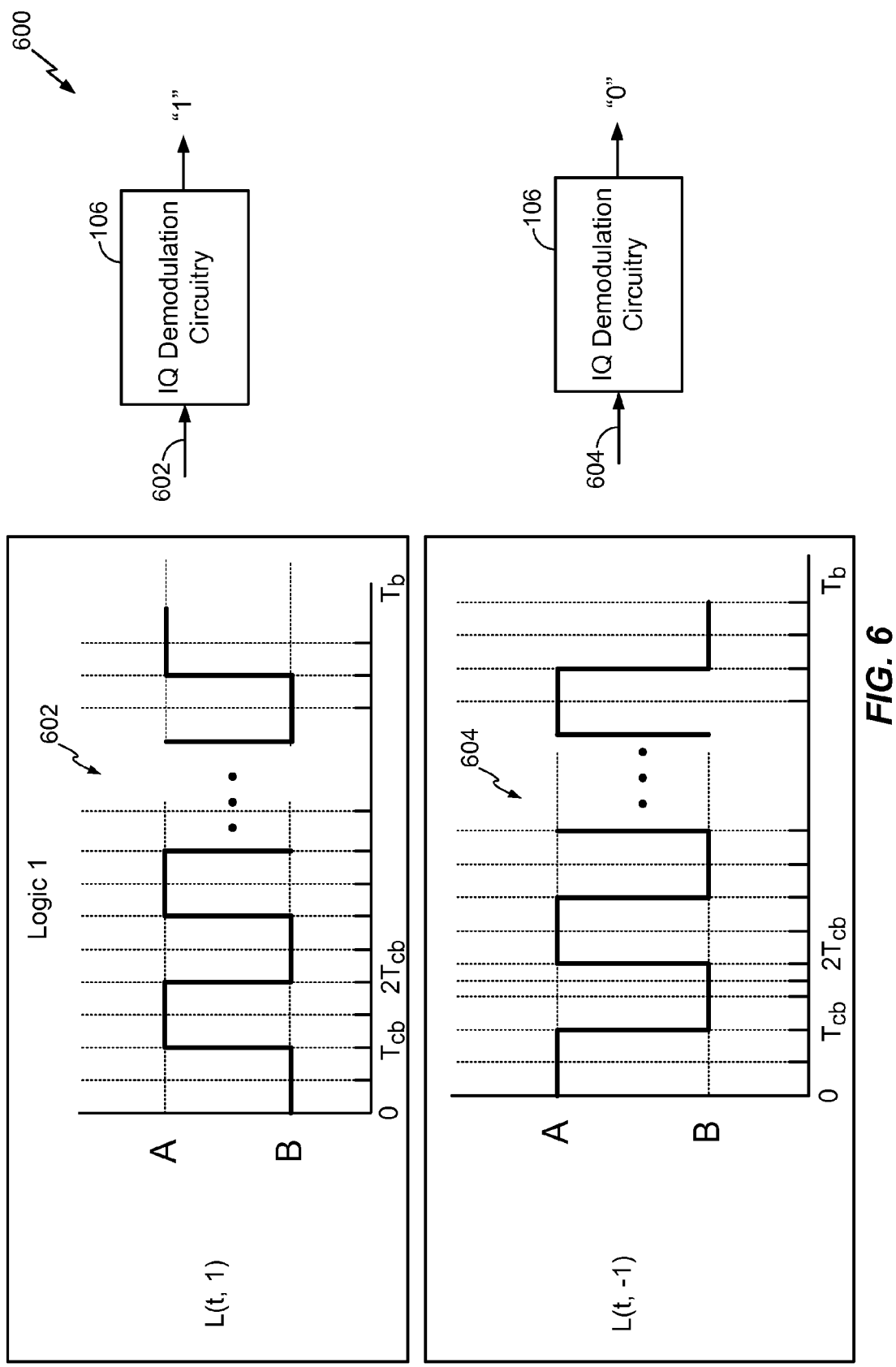
FIG. 6 is a particular illustrative embodiment of a graph illustrating a 212 Kbps or higher Type A load modulation waveform or a Type B load modulation waveform.

Referring to FIG. 6, a particular illustrative embodiment of a graph 600 illustrating a 212 Kbps or higher Type A load modulation waveform or a Type B load modulation waveform is shown.

With reference to the graph 600, a difference between a logical "1" and a logical "0" corresponds to a phase. The logical value (i.e., "0" or "1") may be selected by the maximum likelihood decoder 411 of FIG. 4 even though the amplitudes are similar based on the phase difference (rather than requiring a precise timing of a beginning of a bit period). Thus, the multiplier 410 may adjust the difference between the two portions of a bit duration by the complex conjugate derived during acquisition to determine whether the logical value is a "1" or "0". Examples of the output (e.g., $R_1-R_2$) of the decision filter 408 for the Type F load modulation are:

Type B 106 Kbps: $R_1-R_2$=[-1 1 -1 1 -1 1 -1 1 -1 1 -1 1 -1 1 -1 1]
Type B 212 Kbps: $R_1-R_2$=[-1 1 -1 1 -1 1 -1 1]
Type B 424 Kbps: $R_1-R_2$=[-1 1 -1 1]
Type B 848 Kbps: $R_1-R_2$=[-1 1].

For example, a first load modulated waveform 602 corresponding to a logical "1" may be communicated from the second device 110 to the first device 102 via the oscillating electromagnetic field 116. The first load modulated waveform 602 may be provided to the IQ demodulation circuitry 106 via the oscillating electromagnetic field 116 of FIG. 1. The IQ demodulation circuitry 106 may select a logical "1" based on a phase adjusted comparison value corresponding to the first load modulated waveform 602 in a similar manner as described with respect to FIG. 4.

As another example, a second load modulated waveform 604 corresponding to a logical "0" may be communicated from the second device 110 to the first device 102 via the oscillating electromagnetic field 116. The second load modulated waveform 604 may be provided to the IQ demodulation circuitry 106 via the oscillating electromagnetic field 116 of FIG. 1. The IQ demodulation circuitry 106 may select a logical "0" based on a phase adjusted comparison value corresponding to the second load modulated waveform 604 in a similar manner as described with respect to FIG. 4.

Figure 7:
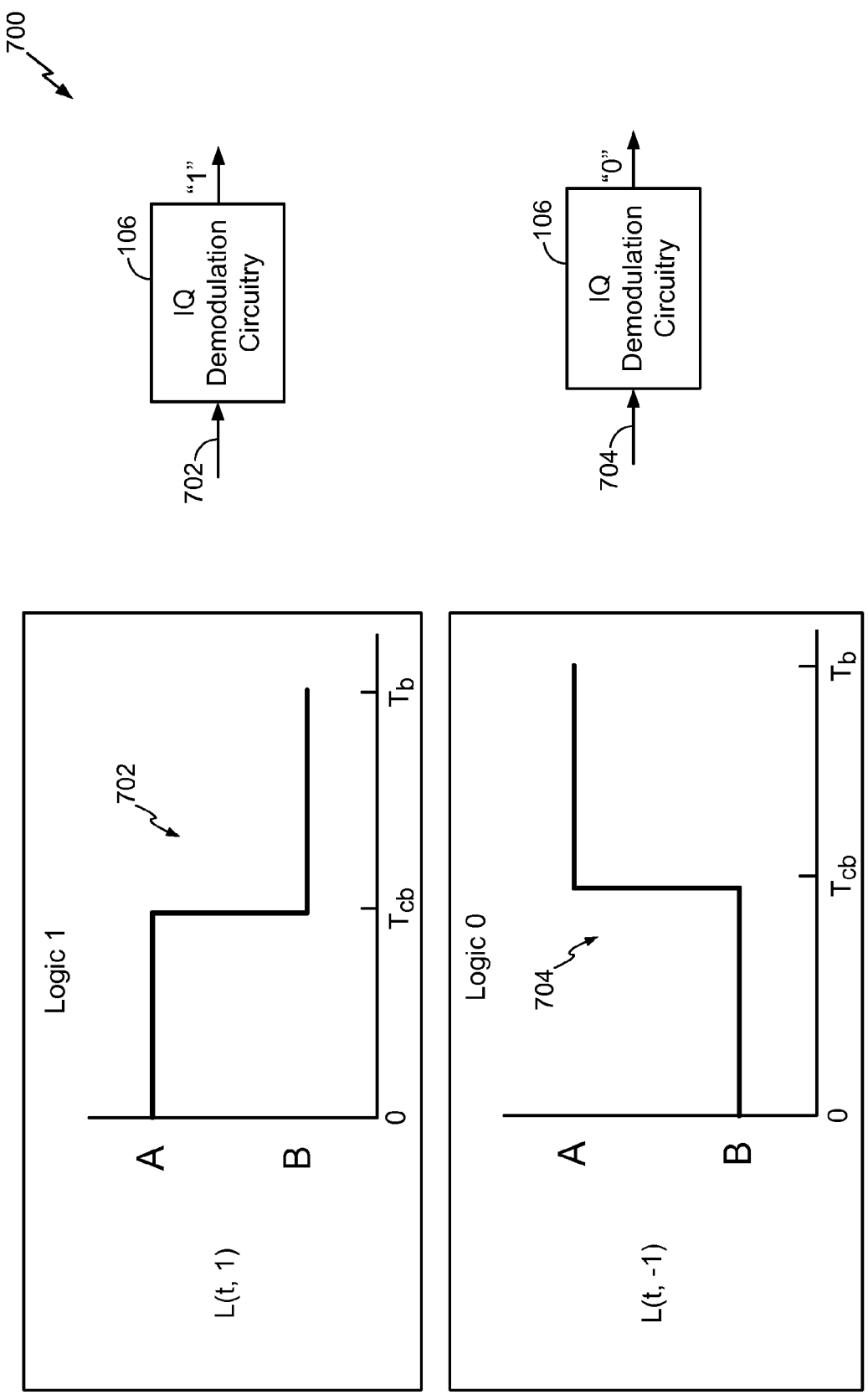
FIG. 7 is a particular illustrative embodiment of a graph illustrating a Type F load modulation waveform.

Referring to FIG. 7, a particular illustrative embodiment of a graph 700 illustrating Type F load modulation waveform is shown. Examples of the output (e.g., $R_1-R_2$) of the decision filter 408 for the Type F load modulation are:

Type F 212 Kbps: $R_1-R_2$=[-1 1 -1 1]
Type F 424 Kbps: $R_1-R_2$=[-1 1 -1 1].

For example, a first load modulated waveform 702 corresponding to a logical "1" may be communicated from the second device 110 to the first device 102 via the oscillating electromagnetic field 116. The first load modulated waveform 702 may be provided to the IQ demodulation circuitry 106 via the oscillating electromagnetic field 116 of FIG. 1. The IQ demodulation circuitry 106 may select a logical "1" based on a phase adjusted comparison value corresponding to the first load modulated waveform 702 in a similar manner as described with respect to FIG. 4.

As another example, a second load modulated waveform 704 corresponding to a logical "0" may be communicated from the second device 110 to the first device 102 via the oscillating electromagnetic field 116. The second load modulated waveform 704 may be provided to the IQ demodulation circuitry 106 via the oscillating electromagnetic field 116 of FIG. 1. The IQ demodulation circuitry 106 may select a logical "0" based on a phase adjusted comparison value corresponding to the second load modulated waveform 704 in a similar manner as described with respect to FIG. 4.

Figure 8:
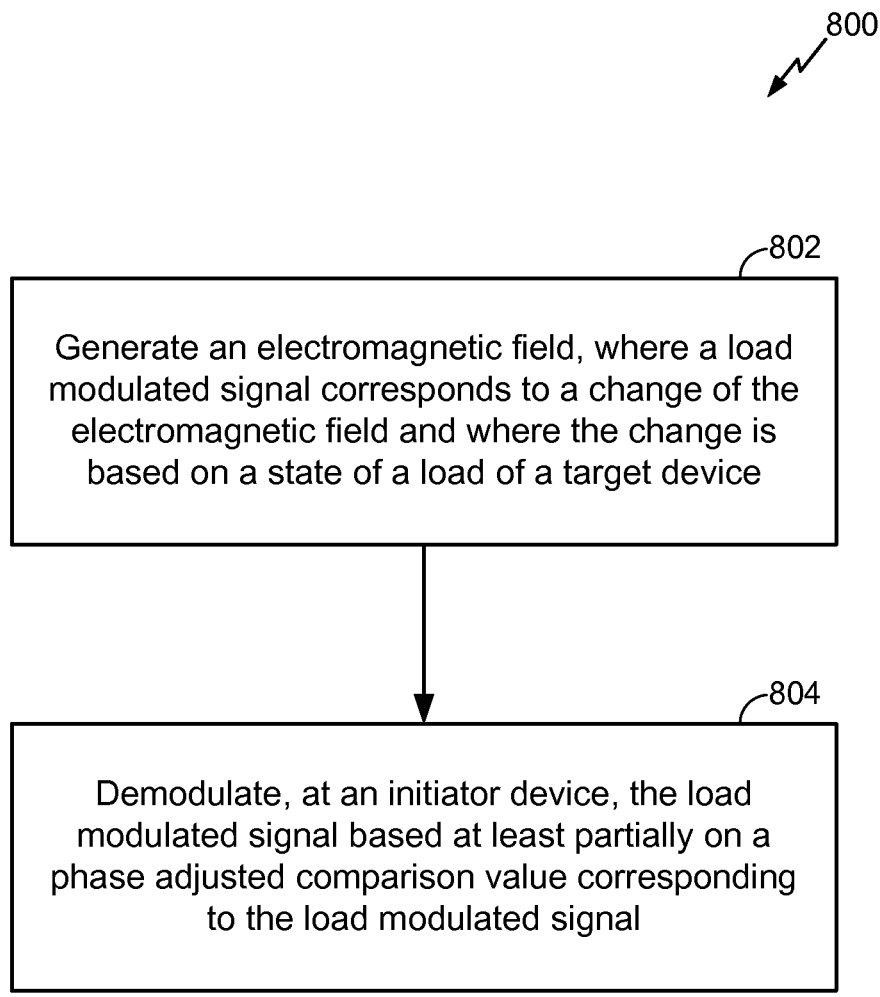
FIG. 8 is a flowchart to illustrate a particular embodiment of a method of demodulating a load modulated signal.

Referring to FIG. 8, a flowchart to illustrate a particular embodiment of a method 800 of demodulating a load modulated signal is shown. The method 800 may be performed by the first device 102 of FIG. 1, a device including the system 300 of FIG. 3, a device including the system 400 of FIG. 4, or any combination thereof.

The method 800 includes generating an electromagnetic field, at 802. For example, in FIG. 1, the first device 102 (i.e., the initiator device) may generate the oscillating electromagnetic field 116. The first device 102 may generate the oscillating electromagnetic field by applying a voltage to the first inductive coil 108. The load modulated signal (i.e., the signal represented in the fifth stage 214) may be detected by the first device 102 in response to a phase change or amplitude change of the oscillating electromagnetic field 116. The change may be based on a state of the load of a target device (i.e., the second device 110).

An initiator device may demodulate the load modulated signal based at least partially on a phase adjusted comparison value corresponding to the load modulated signal, at 804. For example, the IQ demodulation circuitry 106 of the first device 102 may demodulate the load modulated signal based at least partially on a phase adjusted comparison value corresponding to the load modulated signal. To illustrate, the decision filter 408 may provide the comparison value ($R_1-R_2$) to the multiplier 410 and the complex conjugate $A_3^*$ that is determined during signal during acquisition may also be provided to the multiplier 410. The multiplier 410 may generate an adjusted comparison value that corresponds to the comparison value ($R_1-R_2$) rotated by an initial phase offset and/or an initial amplitude determined during signal acquisition. The adjusted comparison value may be provided to the maximum likelihood decoder 411 to determine a most likely logical value that corresponds to the load modulated signal.

It will be appreciated that the method 800 of FIG. 8 may determine a likely logical value corresponding to a load modulated signal based on a change in phase and/or a change in amplitude of an oscillating electromagnetic field as opposed to based solely on a change in amplitude of an oscillating electromagnetic field.

Figure 9:
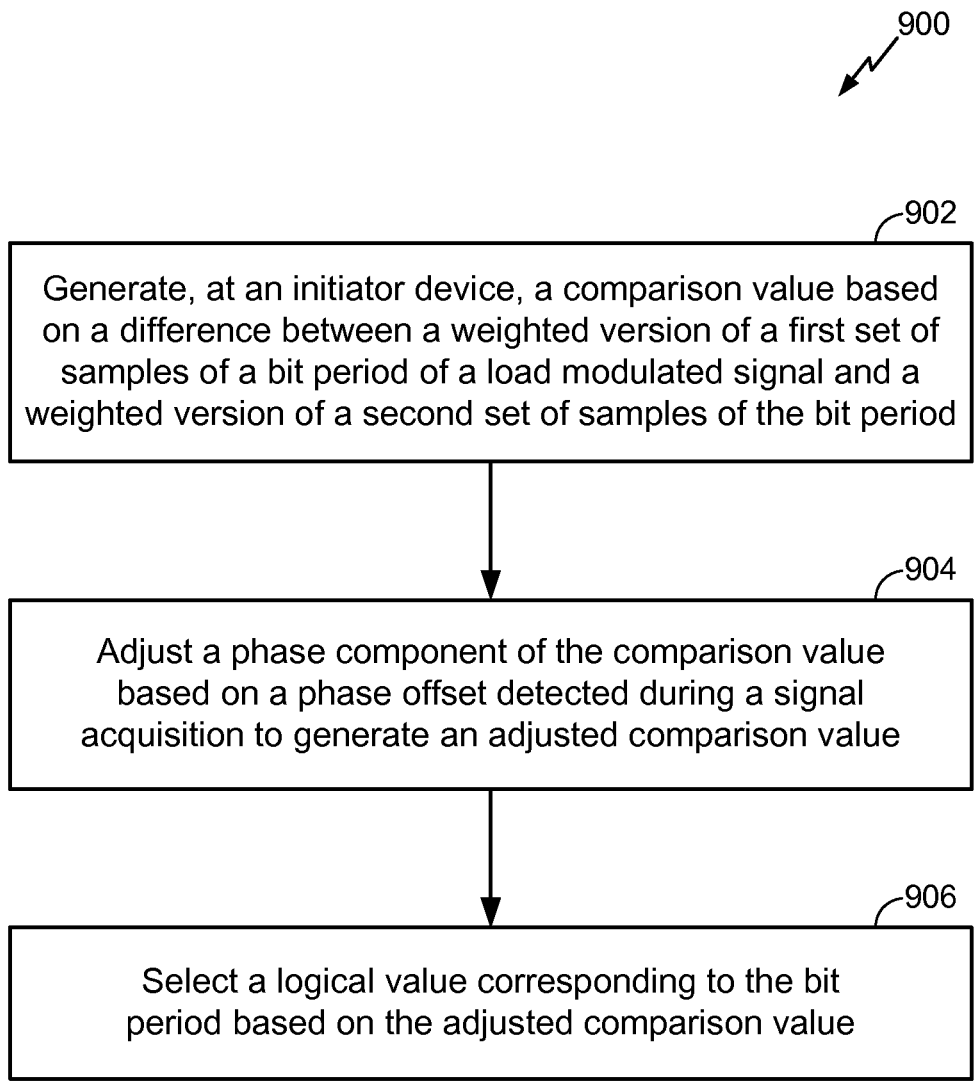
FIG. 9 is a flowchart to illustrate another particular embodiment of a method of demodulating a load modulated signal.

Referring to FIG. 9, a flowchart to illustrate a particular embodiment of a method 900 of demodulating a load modulated signal is shown. The method 900 may be performed by the first device 102 of FIG. 1, a device including the system 300 of FIG. 3, a device including the system 400 of FIG. 4, or any combination thereof The method 900 includes generating, at an initiator device, a comparison value based on a difference between a weighted version of a first set of samples of a bit period of a load modulated signal and a weighted version of a second set of samples of the bit period, at 902. For example, in FIG. 4, the decision filter 408 may generate a comparison value based on a difference between a first set of samples of a bit period of a load modulated signal (e.g., the first portion 202 of the first bit period of FIG. 2) and a second set of samples of the bit period (e.g., the second portion 203 of the first bit period of FIG. 2). In other embodiments (i.e., other coding schemes), the first set of samples and the second set of samples may have different patterns during the bit period.

A phase component of the comparison value may be adjusted based on a phase offset detected during signal acquisition to generate an adjusted comparison value, at 904. For example, in FIG. 4, the multiplier 410 may adjust a phase component of the comparison value based on a phase offset detected during signal acquisition to generate an adjusted comparison value.

A logical value corresponding to the bit period may be selected based on the adjusted comparison value, at 906. For example, in FIG. 4, the maximum likelihood decoder 411 may select a logical value corresponding to the bit period based on the adjusted comparison value.

It will be appreciated that the method 900 of FIG. 9 may facilitate demodulation of a signal that is substantially phase modulated or that is substantially amplitude modulated. The method 900 may also facilitate demodulation of a signal that is phase modulated and amplitude modulated.

Figure 10:
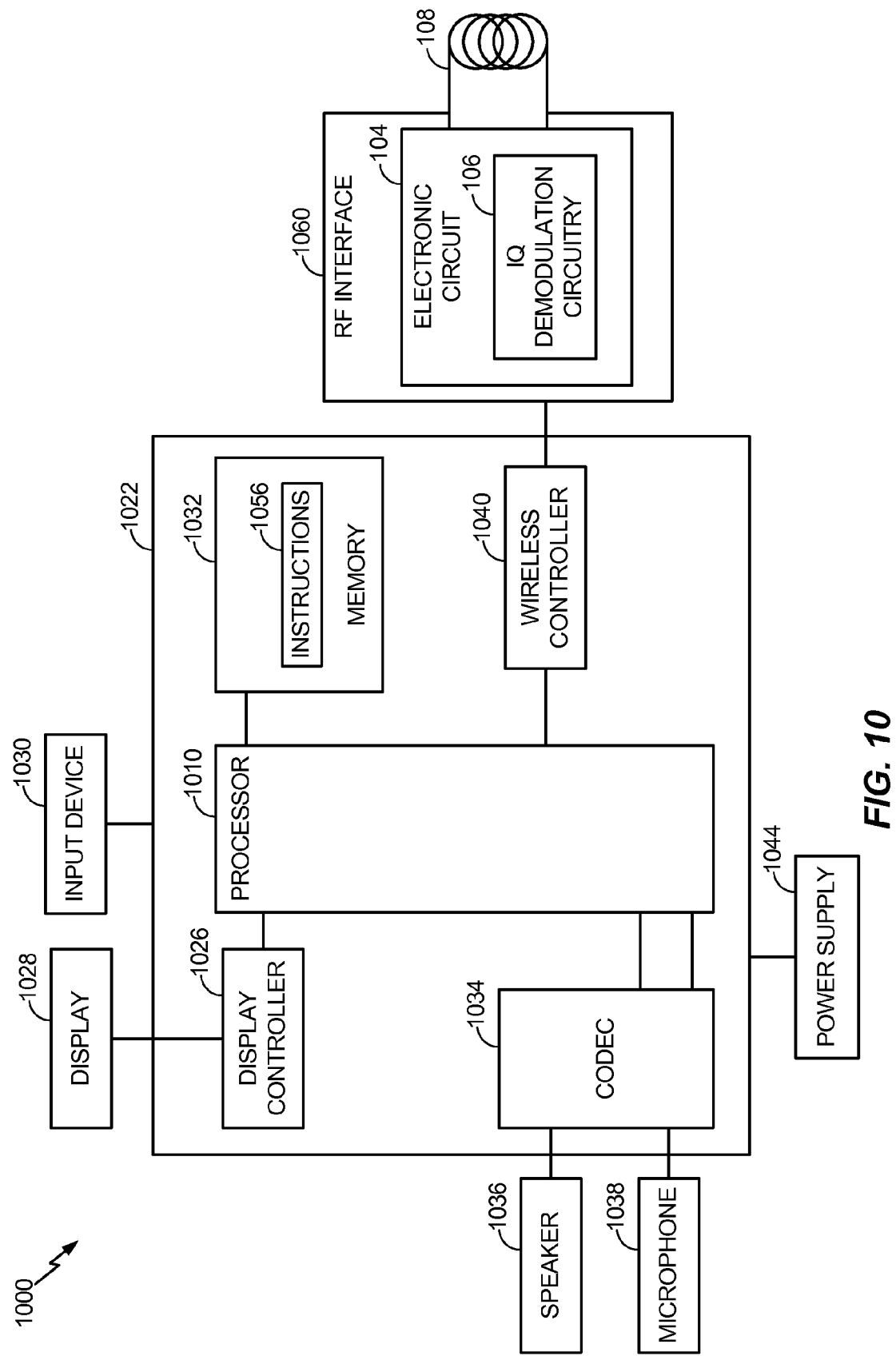
FIG. 10 is a block diagram of a wireless device including a circuit that is operable to demodulate a load modulated signal.

Referring to FIG. 10, a block diagram of a particular illustrative embodiment of a wireless communication device is depicted and generally designated 1000. The device 1000 includes a processor 1010, such as a digital signal processor, coupled to a memory 1032.

FIG. 10 also shows a display controller 1026 that is coupled to the digital signal processor 1010 and to a display 1028. A coder/decoder (CODEC) 1034 can also be coupled to the digital signal processor 1010. A speaker 1036 and a microphone 1038 can be coupled to the CODEC 1034. FIG. 10 also indicates that a wireless controller 1040 can be coupled to the digital signal processor 1010 and to a radio frequency (RF) interface 1080 disposed between the wireless controller 1040 and the first induction coil 108. The RF interface 1080 includes the electronic circuit 104 and the IQ demodulation circuitry 106, such as including the receiver 300 of FIG. 3 and the system 400 of FIG. 4.

The memory 1032 may be a tangible non-transitory processor-readable storage medium that includes executable instructions 1056. The instructions 1056 may be executed by a processor, such as the processor 1010 or a processor within the RF Interface 1060, to demodulate a load modulated signal based at least partially on a phase adjusted comparison value corresponding to the load modulated signal. The instructions 1056 may be executable to generate a comparison value based on a difference between a weighted version of a first set of samples of a bit period of a load modulated signal and a weighted version of a second set of samples of the bit period (e.g., the decision filter 408 of FIG. 4 may be implemented by a processor executable by the instructions). The instructions 1056 may also be executable to adjust a phase component of the comparison value based on a phase offset detected during a signal acquisition to generate an adjusted comparison value (e.g., the multiplier 410 of FIG. 4 may be implemented by a processor executable by the instructions). The instructions 1056 may also be executable to decode a logical value corresponding to the bit period based on the adjusted comparison value (e.g., the maximum likelihood decoder 411 of FIG. 4 may be implemented by a processor executable by the instructions).

In a particular embodiment, the processor 1010, the display controller 1026, the memory 1032, the CODEC 1034, and the wireless controller 1040 are included in a system-in-package or system-on-chip device 1022. In a particular embodiment, an input device 1030 and a power supply 1044 are coupled to the system-on-chip device 1022. Moreover, in a particular embodiment, as illustrated in FIG. 10, the display 1028, the input device 1030, the speaker 1036, the microphone 1038, the RF interface 1060, and the power supply 1044 are external to the system-on-chip device 1022. However, each of the display 1028, the input device 1030, the speaker 1036, the microphone 1038, and the power supply 1044 can be coupled to a component of the system-on-chip device 1022, such as an interface or a controller.

In conjunction with the described embodiments, an apparatus is disclosed that includes means for receiving a load modulated signal based on a change in an electromagnetic field. For example, the means for detecting may include the first device 102 of FIG. 1 implementing the system 300 of FIG. 3, one or more other devices, circuits, modules, or processing devices to receive the load modulated signal, or any combination thereof The apparatus may also include means for demodulating the load modulated signal based at least partially on a phase of the load modulated signal. For example, the means for demodulating may include the first device 102 of FIG. 1 implementing the demodulator 406 of FIG. 4, the processor 1010 of FIG. 10, one or more other devices, circuits, modules, or processing devices to demodulate the load modulated signal, or any combination thereof The apparatus may include means for generating a comparison value based on a difference between a first portion of a bit period of a load modulated signal and a second portion of the bit period. For example, the means for generating the comparison value may include the decision filter 408 of FIG. 4, the processor 1010 of FIG. 10, one or more other devices, circuits, modules, or processing devices to generate the comparison value, or any combination thereof The apparatus may include means for adjusting a phase component of the comparison value based on a phase offset detected during signal acquisition to generate an adjusted comparison value. For example, the means for adjusting may include the multiplier 410 of FIG. 4, the processor 1010 of FIG. 10, one or more other devices, circuits, modules, or processing devices to adjust a phase component of the comparison value, or any combination thereof The apparatus may include means for selecting a logical value corresponding to the bit period based on the adjusted comparison. For example, the means for selecting may include the maximum likelihood decoder 411 of FIG. 4, the processor 1010 of FIG. 10, one or more other devices, circuits, modules, or processing devices to select a logical value, or any combination thereof Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   generating, at demodulation circuitry of an initiating device, a comparison value based on a first sample of a load modulated signal received at the initiating device and based on a second sample of the load modulated signal;
   adjusting, at the demodulation circuitry, a phase component of the comparison value to generate an adjusted comparison value; and
   selecting, at the demodulation circuitry, a logical value based on the adjusted comparison value.

2. The method of claim 1, wherein selecting the logical value is further based at least partially on an amplitude of the load modulated signal.

3. The method of claim 1, further comprising generating an electromagnetic field, wherein the load modulated signal corresponds to a change of the electromagnetic field, and wherein the change is based on a state of a load of a target device.

4. The method of claim 3, wherein the state of the load of the target device corresponds to whether the load of the target device is activated or deactivated.

5. An apparatus comprising:
   means for generating a comparison value based on a first sample of a load modulated signal received at an initiating device and based on a second sample of the load modulated signal;
   means for adjusting a phase component of the comparison value to generate an adjusted comparison value; and
   means for selecting a logical value based on the adjusted comparison value.

6. The apparatus of claim 5, wherein the load modulated signal is based on a change in an electromagnetic field, and wherein the change is based on a state of a load of a target device.

7. The apparatus of claim 5, further comprising means for generating an electromagnetic field, wherein the load modulated signal is based on a change in the electromagnetic field.

8. An apparatus comprising:
   a decision filter configured to generate a comparison value based on a first sample of a load modulated signal received at an initiating device and based on a second sample of the load modulated signal;
   a multiplier configured to adjust a phase component of the comparison value to generate an adjusted comparison value; and
   a decoder configured to determine a logical value based on the adjusted comparison value.

9. The apparatus of claim 8, wherein the load modulated signal is based on a change in an electromagnetic field, and wherein the change is based on a state of a load of a target device.

10. The apparatus of claim 8, wherein the decoder is further configured to demodulate the load modulated signal based on an amplitude of the load modulated signal.

11. The apparatus of claim 9, further comprising circuitry configured to generate the electromagnetic field.

12. A non-transitory computer readable storage medium comprising instructions that, when executed by a processor, cause the processor to:
generate a comparison value based on a first sample of a load modulated signal received at an initiating device and based on a second sample of the load modulated signal;
adjust a phase component of the comparison value to generate an adjusted comparison value; and
select a logical value based on the adjusted comparison value.

13. The non-transitory computer readable storage medium of claim 12, further comprising instructions that, when executed by the processor, cause the processor to determine an amplitude of the load modulated signal.

14. A method comprising:
generating, at an initiator device, a comparison value based on a difference between a weighted version of a first set of samples of a bit period of a load modulated signal and a weighted version of a second set of samples of the bit period;
adjusting a phase component of the comparison value based on a phase offset detected during a signal acquisition of the load modulated signal to generate an adjusted comparison value; and
selecting a logical value corresponding to the bit period based on the adjusted comparison value.

15. The method of claim 14, wherein the first set of samples corresponds to portions of the bit period when a load of a target device is activated and the second set of samples corresponds to portions of the bit period when the load of the target device is deactivated.

16. The method of claim 14, further comprising adjusting an amplitude component of the comparison value based on an amplitude offset detected during the signal acquisition, wherein the amplitude offset and the phase offset correspond to an in-phase/quadrature (IQ) offset.

17. The method of claim 16, wherein the signal acquisition includes detecting a pre-defined sequence of logical values in the load modulated signal, wherein the IQ offset is based on the pre-defined sequence of logical values.

18. An apparatus comprising:
means for generating a comparison value based on a difference between a weighted version of a first set of samples of a bit period of a load modulated signal and a weighted version of a second set of samples of the bit period;
means for adjusting a phase component of the comparison value based on a phase offset detected during a signal acquisition of the load modulated signal to generate an adjusted comparison value; and
means for selecting a logical value corresponding to the bit period based on the adjusted comparison value.

19. The apparatus of claim 18, wherein the means for generating includes a decision filter of a demodulator.

20. The apparatus of claim 18, wherein the means for adjusting includes a multiplier of a demodulator.

21. The apparatus of claim 18, wherein the first set of samples corresponds to portions of the bit period when a load of a target device is activated and the second set of samples corresponds to portions of the bit period when the load of the target device is deactivated.

22. The apparatus of claim 18, further comprising means for adjusting an amplitude component of the comparison value based on an amplitude offset detected during the signal acquisition, wherein the amplitude offset and the phase offset correspond to an in-phase/quadrature (IQ) offset.

23. The apparatus of claim 22, wherein the signal acquisition includes means for detecting a pre-defined sequence of logical values in the load modulated signal, wherein the IQ offset is based on the pre-defined sequence of logical values.

24. An apparatus comprising:
a decision filter configured to generate a comparison value based on a difference between a weighted version of a first set of samples of a bit period of a load modulated signal and a weighted version of a second set of samples of the bit period;
a multiplier configured to adjust a phase component of the comparison value based on a phase offset detected during a signal acquisition of the load modulated signal to generate an adjusted comparison value; and
a maximum likelihood decoder configured to decode a logical value corresponding to the bit period based on the adjusted comparison value.

25. The apparatus of claim 24, wherein the first set of samples corresponds to portions of the bit period when a load of a target device is activated and the second set of samples corresponds to portions of the bit period when the load of the target device is deactivated.

26. The apparatus of claim 24, wherein the multiplier is further configured to adjust an amplitude component of the comparison value based on an amplitude offset detected during the signal acquisition, wherein the amplitude offset and the phase offset correspond to an in-phase/quadrature (IQ) offset.

27. The apparatus of claim 26, wherein a pre-defined sequence of logical values in the load modulated signal is detected during the signal acquisition and wherein the IQ offset is based on the pre-defined sequence of logical values.

28. The apparatus of claim 24, wherein the comparison value is at least partially based on an amplitude difference between the weighted version of the first set of samples and the weighted version of the second set of samples.

29. The apparatus of claim 24, wherein the comparison value is at least partially based on a phase difference between the weighted version of the first set of samples and the weighted version of the second set of samples.

30. A non-transitory computer readable storage medium comprising instructions that, when executed by a processor, cause the processor to:
generate a comparison value based on a difference between a weighted version of a first set of samples of a bit period of a load modulated signal and a weighted version of a second set of samples of the bit period;
adjust a phase component of the comparison value based on a phase offset detected during a signal acquisition of the load modulated signal to generate an adjusted comparison value; and
decode a logical value corresponding to the bit period based on the adjusted comparison value.

31. The non-transitory computer readable storage medium of claim 30, wherein the first set of samples corresponds to portions of the bit period when a load of a target device is activated and the second set of samples corresponds to portions of the bit period when the load of the target device is deactivated.

32. The non-transitory computer readable storage medium of claim 30, further comprising instructions that, when executed by the processor, cause the processor to adjust an amplitude component of the comparison value based on an amplitude offset detected during the signal acquisition, wherein the amplitude offset and the phase offset correspond to an in-phase/quadrature (IQ) offset.

33. The non-transitory computer readable storage medium of claim 32, wherein a pre-defined sequence of logical values in the load modulated signal is detected during the signal acquisition and wherein the IQ offset is based on the pre-defined sequence of logical values.

34. The non-transitory computer readable storage medium of claim 30, wherein the comparison value is a least partially based on an amplitude difference between the weighted version of the first set of samples and the weighted version of the second set of samples.

35. The non-transitory computer readable storage medium of claim 30, wherein the comparison value is at least partially based on a phase difference between the weighted version of the first set of samples and the weighted version of the second set of samples.

36. The non-transitory computer readable storage medium of claim 30, wherein the first set of samples corresponds to a first portion of the bit period and the second set of samples corresponds to a second portion the bit period.

* * * * *